United States Patent [19]

Stackhouse et al.

[11] 4,376,310
[45] Mar. 8, 1983

[54] MOBILE DATA TERMINAL CHANNEL BUSY ARRANGEMENT

[75] Inventors: Bill L. Stackhouse; Theodore E. Taylor, both of Lynchburg, Va.

[73] Assignee: General Electric Company, Lynchburg, Va.

[21] Appl. No.: 263,205

[22] Filed: May 13, 1981

[51] Int. Cl.³ .............................................. H04Q 7/04
[52] U.S. Cl. .................................... 375/104; 375/111; 455/34; 455/58
[58] Field of Search .............. 375/106, 113, 114, 121, 375/104, 111; 455/35-38, 221, 222, 225, 51, 58, 34; 179/2 EB

[56] References Cited

U.S. PATENT DOCUMENTS

| | | | |
|---|---|---|---|
| 2,691,723 | 10/1954 | Nordahl | 455/34 |
| 3,376,509 | 4/1968 | Willcox et al. | 455/58 |
| 3,485,953 | 12/1969 | Norberg | 455/58 |
| 3,496,467 | 2/1970 | Lundgren | 455/35 |
| 3,617,644 | 11/1971 | Boag | 455/34 |
| 3,938,156 | 2/1976 | Lunden | 455/28 |
| 4,013,959 | 3/1977 | Patterson | 455/58 |
| 4,044,309 | 8/1977 | Smith | 455/221 |
| 4,281,413 | 7/1981 | Forrest | 179/2 EB |

Primary Examiner—Benedict V. Safourek
Assistant Examiner—Stephen Chin
Attorney, Agent, or Firm—Cushman, Darby & Cushman

[57] ABSTRACT

A channel busy arrangement for use in a radio-based data transmission system comprising a plurality of data terminals. A carrier activity signal (CAS) generated by a receiver associated with a data terminal is used to trigger a CAS pulse of approximately 300 msec. A demodulated audio signal from the receiver is coupled to a SYNC detector for detecting a data synchronizing (SYNC) signal generally transmitted before a data message and to an optional continuous tone coded squelch system (CTCSS) for generating a CTCSS signal. The CAS pulse, SYNC signal and CTCSS signal are logic ORed to generate a channel busy signal used for inhibiting data transmission. Thus, data transmission is inhibited only during a 300 msec CAS pulse, when a SYNC signal is present, or during valid non-data transmissions (voice) even in the presence of an interfering signal.

9 Claims, 4 Drawing Figures

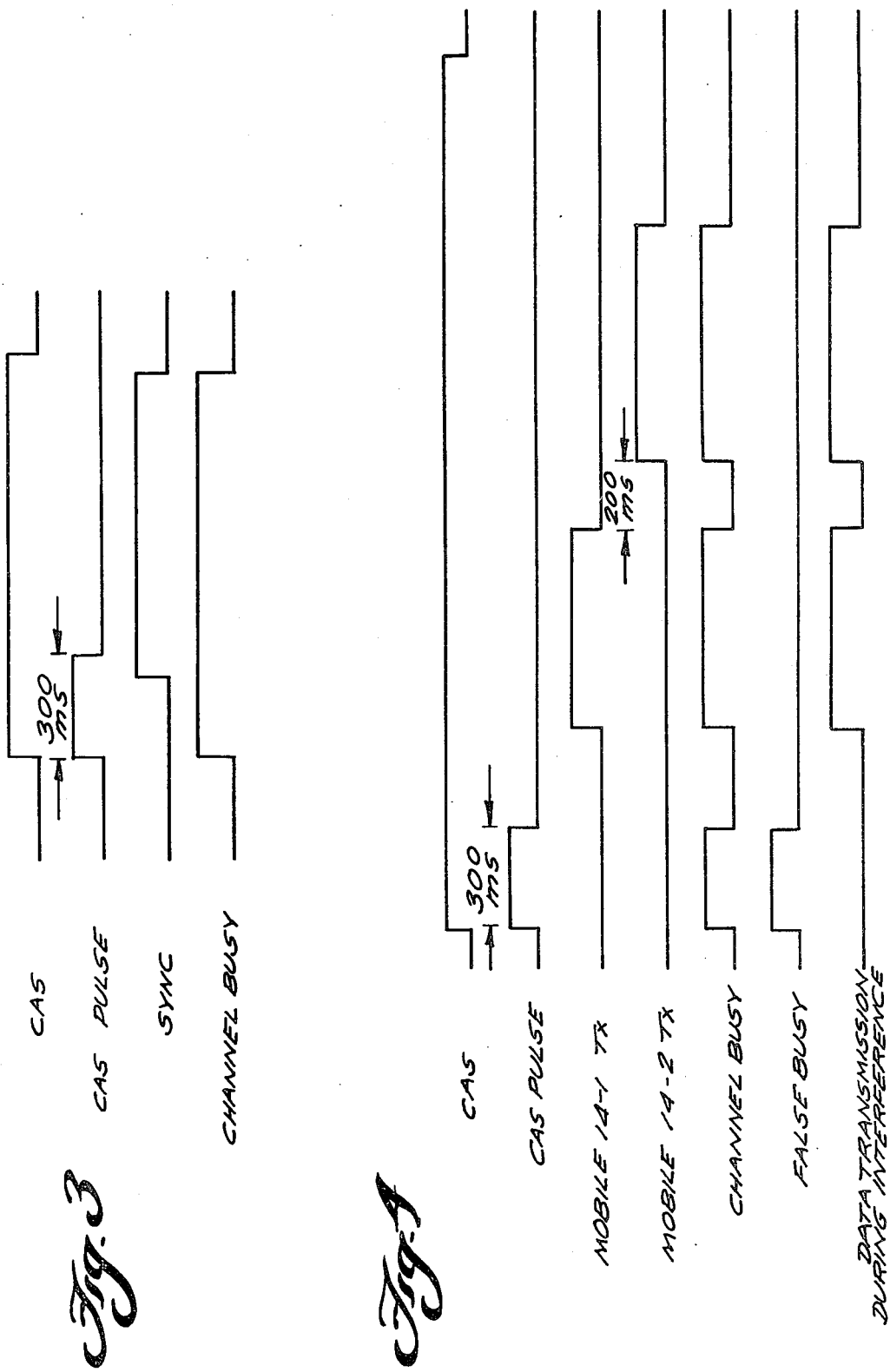

MOBILE DATA TERMINAL CHANNEL BUSY ARRANGEMENT

BACKGROUND OF THE INVENTION

This invention is directed in general to data transmission systems. More specifically, the invention is directed to data transmission systems of the type including a data processing unit associated with a base radio station and one or more mobile or portable data terminals each associated with a mobile or portable radio by which digital data is transmitted among the various data terminals over at least one radio channel.

Referring to FIG. 1, a typical radio data transmission system includes a base radio station 10 controlled by or connected to a data processing unit 12. The base station and data processsing unit communicate with one or more mobile or portable stations 14 over a radio channel. The radio link may include a repeater 16 and may be either simplex or duplex. In systems including a plurality of mobile or portable stations wherein each has the capability of accessing a shared communication channel, it is necessary to prevent contention on the radio channel. To prevent contention, mobile or portable stations generally include a logic device for generating a channel busy signal. This channel busy signal is a function of some signal received on the communication channel. Generally, the channel busy signal is generated whenever a receiver, associated with a mobile or portable data terminal, detects any signal on the radio channel. The effect of the channel busy signal is to inhibit data transmission by the data terminal detecting such signal so that it will not interfere with another data terminal already using the channel. Data transmission systems may, in addition to transmitting digital data, provide for the transmission of voice traffic.

When operating known radio data transmission systems, the presence of long-term interference (spurious signals) on a radio channel causes a serious operational difficulty. The logic used in known data transmission systems generates a channel busy signal which does not adequately discriminate between legitimate data or voice transmission on the channel and an interfering spurious signal. Thus, very often data transmission is inhibited when a data terminal detects a spurious signal (noise) on the channel. Although it is appropriate for a particular data terminal to have its transmission inhibited when another data terminal is transmitting a data or voice signal on the channel, it is not desirable to inhibit transmission merely when there is noise on the channel. Inhibiting data transmission each time there is noise on the radio channel causes a significant down time for a data terminal and subsequent loss of throughput. Using conventional logic, a data terminal is usable only as long as no radio interference is received by the repeater, the base station or the mobile or portable data terminal itself. If either the base station or repeater receives a spurious interfering signal that is interpreted as a valid RF signal for that receiver, a carrier activity signal (known more particularly as a Carrier Activated Switch or CAS signal) is generated by the receiver associated therewith indicating that the radio channel is busy. A CAS signal alone is sufficient to generate, according to the conventional logic, a busy signal. A data terminal seeing this busy signal recognizes the channel as being busy when in fact it is not busy. Thus, data traffic is completely inhibited until the spurious signal is no longer received by either the base station or repeater.

Similarly, a particular mobile or portable data terminal can receive a spurious signal. Upon such reception, the mobile or portable unit receiving a spurious signal generates a false channel busy signal inhibiting its own transmission until the interfering signal leaves. Both of these cases present an undesirable situation.

In data transmission systems including voice transmission capability, a continuous tone coded squelch system (CTCSS) is generally used to unmute radio speakers for voice communication. A typical CTCSS arrangement is illustrated by U.S. Pat. No. 4,171,516—Challen et al., incorporated herein by reference. In voice systems already utilizing a CTCSS, it would be possible to add a second CTCSS to protect against noise. However, the addition of a second CTCSS to protect against noise would be quite costly. In addition, a second CTCSS would not be easily accommodated in most mobile radio units designed to accept one such CTCSS circuit.

Known techniques for addressing the false channel busy problem involve the use of any of several different receiver signals to generate the carrier activity signal (CAS) for inhibiting all other mobile or portable units on the radio channel when any one unit is transmitting. A CTCSS could be part of the specific circuit arrangement used to generate the CAS. However, if a CTCSS circuit is used as part of the logic busy function in this manner, a second CTCSS cannot be used conveniently for unmuting speakers since the radio does not accommodate two circuits. If no CTCSS circuit is used, interfering signals can "busy out" the system especially if there is a repeater in the system.

SUMMARY OF THE INVENTION

Therefore, the present invention provides a more sophisticated arrangement for generating a channel busy signal for inhibiting data terminal transmission. The arrangement is less likely to generate a false busy signal in the presence of noise on the radio channel. In essence, the arrangement provides a logical channel busy signal that includes a combination of logical events comprising a channel busy function rather than simply using the CAS.

According to the present invention, the conventional CAS provided by a radio receiver is used to generate a CAS pulse having a leading edge corresponding to the onset of the CAS. This CAS pulse has a duration of approximately 300 milliseconds (this length can be varied to accommodate the particular data format of any system) and provides a short busy signal to inhibit transmission during the time interval between the leading edge of the carrier activity signal and the detection of a SYNC signal representing digital synchronization data, preceding a digital data message. The logic combination of the CAS pulse and the SYNC signal provides a novel channel busy signal. In response to this new channel busy signal, a particular data terminal assumes that a radio channel is busy and, therfore, inhibits transmission if the CAS pulse or the SYNC function is present.

The CAS pulse ensures that continuous RF interference does not generate a channel busy signal for more than the duration of the CAS pulse unless a SYNC signal indicating data transmission by another terminal is detected. The CAS pulse duration is selected to be insignificant with respect to the total interference time period or the total channel time. The SYNC signal indicates that a mobile or base station is transmitting data consisting of variable or fixed length messages whose length description is either part of the data stream or known by all data terminals in the system. Therefore, data terminals in the system do not attempt to acquire the channel during the channel busy time defined by the data format.

If the radio channel is used for voice transmission as well as digital data, a CTCSS circuit is used in each mobile, portable and base station to unmute the speakers during voice transmission. The output of the CTCSS circuit, if used, is incorporated into the channel busy signal via a logical OR function of the CAS pulse, the SYNC signal and the output of a CTCSS decoder circuit.

BRIEF DESCRIPTION OF THE DRAWINGS

FIG. 3 is a timing diagram showing the various signals of the channel busy arrangement illustrating operation of a second mobile data terminal in response to transmission by a first mobile data terminal in the absence of interference; and FIG. 4 is a timing diagram showing various signals of the channel busy arrangement wherein there is interference on the radio channel.

DETAILED DESCRIPTION OF THE PREFERRED EMBODIMENT

Figure 1:
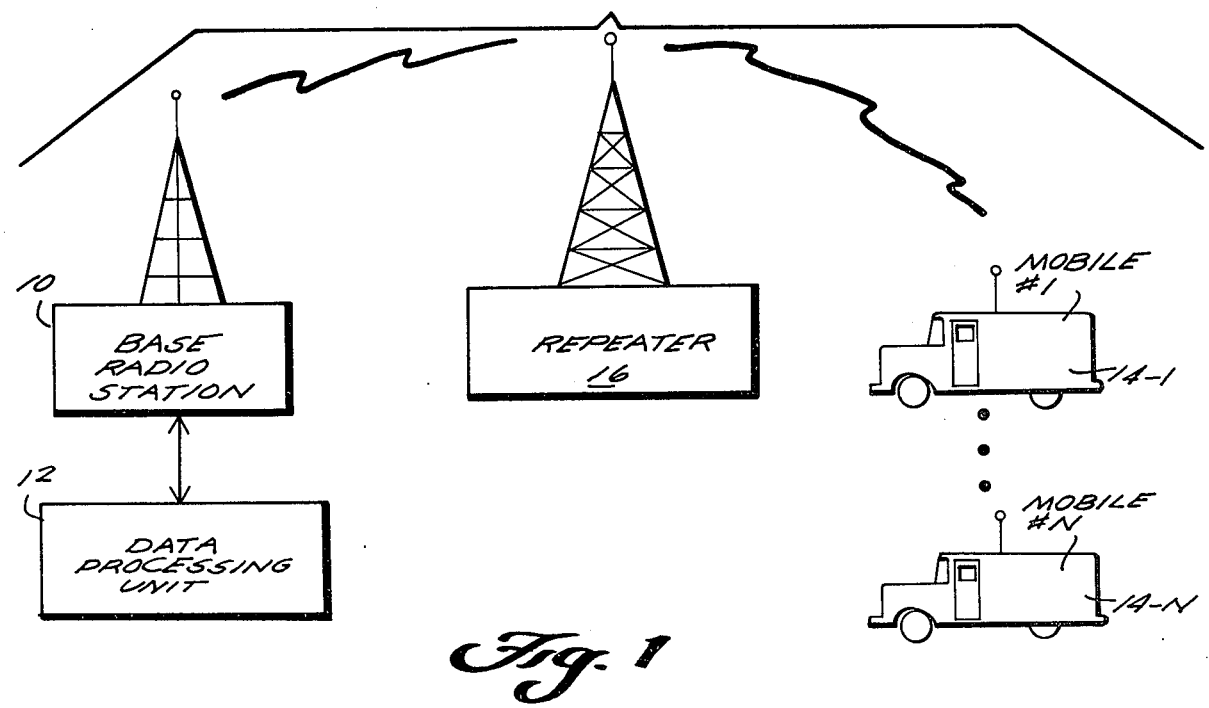
FIG. 1 is a schematic representation of a data transmission system of the general type to which the present invention applies.
Figure 2:
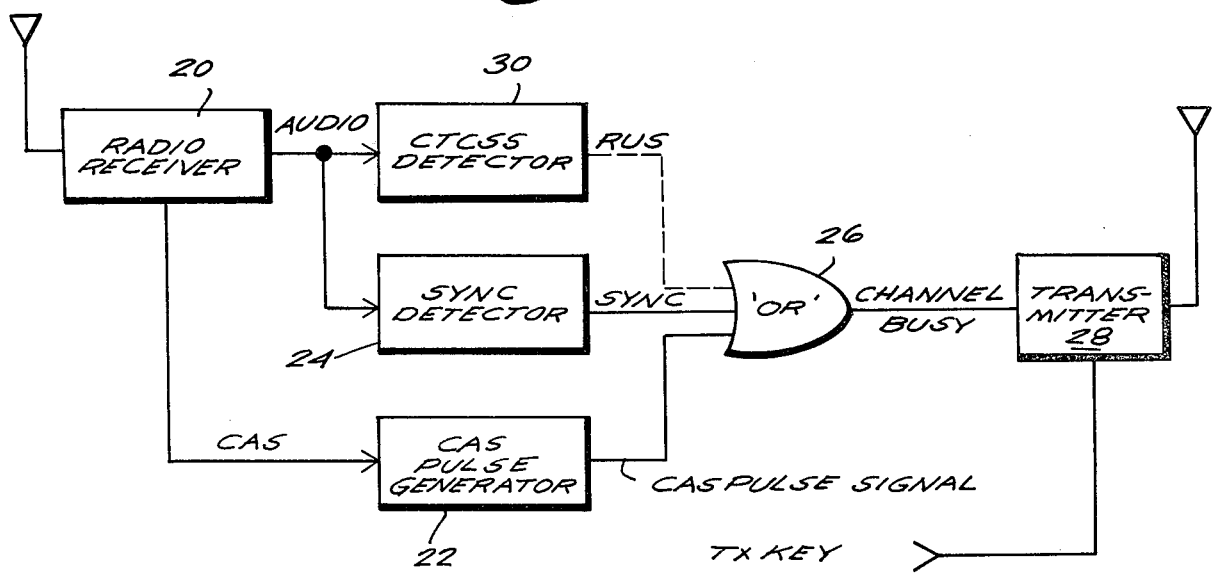
FIG. 2 is a block diagram of the channel busy arrangement according to the present invention.

Referring now to FIG. 2, there is shown a block diagram of the channel busy arrangement according to the present invention. The channel busy arrangement can be built into any of base station 10, mobile stations 14, and repeater 16. For maximum benefit, it should be used with all data terminals in a data transmission system. Associated with each such station there is a radio receiver 20. Radio receiver 20 provides a demodulated audio signal and a carrier activated switch (CAS) signal. In conventional systems, the CAS provides the channel busy inhibit function. However, in the presence of continuous or almost continuous interference, the CAS signal will always be present and the transmit function will be continuously inhibited.

However, in the channel busy arrangement according to the present invention, the CAS is coupled to a CAS pulse generator 22 which generates a CAS pulse signal having a leading edge corresponding to the leading edge of the CAS signal. The CAS pulse signal has a predetermined duration, typically 300 milliseconds. The demodulated audio signal is coupled to a SYNC detector 24 which detects synchronizing bits preceding a data message. In response to detection of synchronizing bits, SYNC detector 24 generates a SYNC signal output. The SYNC signal output is logically ORed with the CAS pulse signal by an OR gate 26 to generate a channel busy signal. This channel busy signal is coupled to a transmitter 28 associated with the base station, repeater, or mobile station to inhibit the transmit function otherwise triggered by a transmit key.

Although the logic function is expressed in FIG. 2 by an OR gate indicating a "hard wired" system, the various signals and logic function can be configured as a computer based system wherein the logic function is carried out by a program associated with the computer. In either embodiment, the logic function is essentially the same.

For data transmission systems that carry voice message as well as digital data message, a CTCSS 30 is coupled to the demodulated audio signal from receiver 20. In the presence of voice transmission, CTCSS detector 30 provides a receiver unsquelch signal (RUS) which is ORed by OR gate 26 with the SYNC and CAS signals.

Referring now to FIG. 3, there is shown a timing diagram indicating the relationship of the various signals generated by the arrangement shown in FIG. 2 for the case when there is no interference on the radio channel. The CAS line represents the CAS from radio receiver 20. The CAS pulse line indicates a CAS pulse signal generated by CAS pulse generator 22. In this example, the CAS pulse has a duration of 300 milliseconds and is considerably shorter than the CAS signal. The 300-millisecond duration of the CAS pulse is selected to provided sufficient time for the detection of a SYNC signal if it exists. The duration of the CAS pulse is selected in accordance with the attack time, data rate and data format of the messages transmitted by the data transmission system. The channel busy signal generated by OR gate 26 is shown on the last line of the Figure. As shown, the channel busy signal in this case has a leading edge coinciding with the leading edges of the CAS and CAS pulse signals and a trailing edge coinciding with the trailing edge of the SYNC signal.

Referring now to FIG. 4, there is shown a timing diagram illustrating the relationship of the various signals shown in FIG. 2 for a case in which RF interference on the radio channel is present. It is assumed that interference is continuously present as shown by the CAS signal on the first line thereof. Using a conventional system, the transmission of data by any unit would be inhibited for the entire duration of the CAS signal. However, using the present invention, a CAS pulse having a 300-millisecond duration is generated as shown on the second line. A transmission by mobile 14-1 is presented by the third line. Mobile 14-1 begins transmission approximately 300 milliseconds after the end of the CAS pulse. Mobile 14-2 begins transmitting approximately 200 milliseconds after the end of transmission by mobile 14-1. A channel busy signal, generated by another mobile, the repeater or base station, is represented by the fifth line of the Figure. It indicates channel busy during the CAS pulse and during transmission by either of the mobile stations. In essence, only the initial CAS pulse represents a false busy signal as shown by the sixth line of the Figure. Using the present invention, rather than have transmission impeded for the entire duration of the CAS signal shown on the first line, data transmission occurs during interference as shown on the last line showing transmissions by mobile 14-1 and 14-2.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims which scope is to be accorded the broadest interpretation so as to encompass all such modifications and equivalent structures.

What is claimed is:

1. An arrangement, for use with a data terminal capable of transmitting or receiving a digital data message including a data synchronizing signal, for determining the busy/free status of a radio channel, comprising:
   a radio receiver providing (a) a demodulated audio signal and (b) a carrier activated switch (CAS) signal indicating the presence of a carrier signal or noise on the radio channel;
   a SYNC detector, for generating, in response to said demodulated audio signal, a SYNC signal whenever said demodulated audio signal includes said data synchronizing signal;
   a pulse generator, for generating, in response to said CAS signal, a CAS pulse having a predetermined duration; and
   logic OR function means for generating a channel busy signal responsive to the presence of either said SYNC signal or said CAS pulse, said channel busy signal for inhibiting transmission of a data message by said data terminal.

2. An arrangement according to claim 1 further including a continuous tone coded squelch system (CTCSS) for generating, responsive to said demodulated audio signal, a receiver unsquelch (RUS) signal, said RUS signal being logically OR gated with said SYNC signal and said CAS pulse by said logic OR function means, said CTCSS for use with radio systems wherein voice transmission is used in addition to digital data transmission, said CTCSS detecting the presence of valid non-data transmissions.

3. An arrangement according to either claim 1 or claim 2 wherein said pulse generator generates said CAS pulse so as to have a leading edge substantially coinciding with a leading edge of said CAS signal.

4. An arrangement according to claim 3 wherein the duration of said CAS pulse is substantially 300 milliseconds.

5. In a data transmission system wherein data terminals transmit digital data messages including a synchronizing signal and digital data modulated on a carrier signal over a radio channel and wherein a receiver, associated with a data terminal, receives a digital data message, demodulates to produce a demodulated audio signal and generates a carrier activated switch (CAS) signal indicative of a carrier or noise on the radio channel indicating that the channel is busy, said CAS signal being utilized to inhibit data transmission by the data terminal, the improvement comprising:
   providing a pulse generator for generating, in response to said CAS signal, a CAS pulse having a predetermined duration;
   a SYNC detector for generating a SYNC signal whenever said receiver detects a synchronizing signal; and
   logic OR function means responsive to said CAS pulse and to said SYNC signal for inhibiting data transmission for an interval of time corresponding to the duration of said CAS pulse while determining whether a SYNC signal will appear or not and providing a channel busy signal extending beyond the duration of SYNC signal.

6. An improvement according to claim 5 further comprising a continuous tone coded squelch system (CTCSS) for generating, responsive to said demodulated audio signal, a receiver unsquelch (RUS) signal, said RUS signal being logically OR gated with said SYNC signal and said CAS pulse by said logic OR function means, said CTCSS for use with radio systems wherein voice transmission is used in addition to digital data transmission, said CTCSS detecting the presence of valid non-data transmissions.

7. An improvement according to claim 5 or 6 wherein said pulse generator generates said CAS pulse so as to have a leading edge substantially coinciding with a leading edge of said CAS signal.

8. An improvement according to claim 7 wherein the duration of said CAS pulse is substantially 300 milliseconds.

9. A method for determining the busy/free status of a radio channel used for transmission by a data terminal of a data message including synchronizing signals and data signals modulated on a carrier signal, comprising:
   first detecting, with a radio receiver, a signal from said radio channel to provide (a) a demodulated audio signal and (b) a carrier activated switch (CAS) signal indicating the presence of a carrier signal or noise on the radio channel;
   second generating, in response to said audio signal, a SYNC signal whenever said audio signal includes a data synchronizing signal as part of a digital data message;
   third generating, in response to said CAS signal, a CAS pulse having a predetermined duration; and
   OR-gating said SYNC signal and said CAS pulse to generate a channel busy signal for inhibiting the transmission of data by said data terminal.

* * * * *